United States Patent
Wang et al.

(10) Patent No.: US 7,433,243 B2
(45) Date of Patent: Oct. 7, 2008

(54) OPERATION METHOD OF NON-VOLATILE MEMORY

(75) Inventors: Shih-Chen Wang, Taipei (TW);
Hsin-Ming Chen, Tainan County (TW);
Chun-Hung Lu, Yunlin (TW);
Ming-Chou Ho, Hsinchu (TW);
Shih-Jye Shen, Hsinchu (TW);
Ching-Hsiang Hsu, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 176 days.

(21) Appl. No.: 11/557,975

(22) Filed: Nov. 9, 2006

(65) Prior Publication Data

US 2007/0109869 A1    May 17, 2007

Related U.S. Application Data

(60) Provisional application No. 60/597,210, filed on Nov. 17, 2005, provisional application No. 60/743,630, filed on Mar. 22, 2006.

(51) Int. Cl.
*G11C 11/34* (2006.01)

(52) U.S. Cl. .............................. 365/185.28; 365/185.18

(58) Field of Classification Search ............ 365/185.28, 365/185.18; 257/324
See application file for complete search history.

(56) References Cited

U.S. PATENT DOCUMENTS

| | | | |
|---|---|---|---|
| 6,667,510 B2 * | 12/2003 | Wu ............................ | 257/319 |
| 6,862,251 B2 | 3/2005 | Yaoi et al. | |
| 6,992,925 B2 | 1/2006 | Peng | |
| 2002/0142535 A1 * | 10/2002 | Ho et al. ..................... | 438/201 |
| 2003/0156460 A1 * | 8/2003 | Wu ........................ | 365/185.33 |

* cited by examiner

*Primary Examiner*—Tuan T. Nguyen
(74) *Attorney, Agent, or Firm*—Jianq Chyun IP Office

(57) ABSTRACT

A non-volatile memory formed on a first conductive type substrate is provided. The non-volatile memory includes a gate, a second conductive type drain region, a charge storage layer, and a second conductive type first lightly doped region. The gate is formed on the first conductive type substrate. The second conductive type drain region is formed in the first conductive type substrate at the first side of the gate. The charge storage layer is formed on the first conductive type substrate at the first side of the gate and between the second conductive type drain region and the gate. The second conductive type first lightly doped region is formed in the first conductive type substrate at the second side of the gate. The second side is opposite to the first side.

33 Claims, 17 Drawing Sheets

OPERATION METHOD OF NON-VOLATILE MEMORY

CROSS-REFERENCE TO RELATED APPLICATION

This application claims the priority benefit of U.S. provisional applications ser. No. 60/597,210, filed on Nov. 17, 2005 and 60/743,630, filed on Mar. 22, 2006, all disclosures are incorporated therewith.

BACKGROUND OF THE INVENTION

1. Field of the Invention

The present invention relates to a semiconductor device. More particularly, the present invention relates to an operation method of non-volatile memory.

2. Description of Related Art

Electrically erasable programmable read-only memory (EEPROM) is a non-volatile memory wherein data can be written, read, or erased repeatedly, and the data stored in an EEPROM remains even when the power supply is turned off. Thus, EEPROM has become broadly applied to personal computers and other electronic apparatuses.

Presently, a non-volatile memory having a charge storage layer of silicon nitride is provided. Such silicon nitride charge storage layer usually has respectively a silicon oxide layer on the top and at the bottom, so as to form a memory cell of silicon-oxide-nitride-oxide-silicon (SONOS) structure. When voltages are supplied to the control gate and the source region/drain regions of the device to program the device, hot electrons are produced in the channel region and close to the drain region and are injected into the charge storage layer. The electrons injected into the charge storage layer are not distributed evenly in the entire charge storage layer, instead, the electrons stay in a particular area in the charge storage layer and present Gaussian distribution in the direction of the channel, thus, leakage current won't be produced easily.

However, when fabricating a SONOS memory, the gate of a SONOS memory cell in the memory cell region and the gate of a transistor in the logic circuit region are usually formed within the same step, and the oxide/nitride/oxide (ONO) layer of the SONOS memory cell and the gate oxide of the transistor in the logic circuit region are then patterned right after the gates are formed. However, since the thicknesses and structures of the oxide/nitride/oxide layer of the SONOS memory cell and the gate oxide of the transistor in the logic circuit region are very different, the thickness of the gate oxide becomes thinner and thinner along with the minimization of the device. Thus, it is very difficult to completely pattern the oxide/nitride/oxide layer of the SONOS memory cell and to prevent the substrate surface of the logic circuit region from being over-etched and producing recess. To resolve the foregoing problems, the SONOS memory cell in the memory cell region and the transistor in the logic circuit region are fabricated separately, and which complicates the fabricating process.

SUMMARY OF THE INVENTION

Accordingly, the present invention is directed to provide an operation method of non-volatile memory. The structure of the non-volatile memory is very simple, and the manufacturing process thereof is compatible with general logic circuit processes.

The present invention provides an operation method of a non-volatile memory. The operation method is suitable for a memory cell formed on a first conductive type substrate. The memory cell includes a gate formed on the first conductive type substrate, a second conductive type drain region and a second conductive type source region formed in the first conductive type substrate at two sides of the gate, a charge storage layer formed on the first conductive type substrate between the gate and the second conductive type drain region, and a second conductive type first lightly doped region formed in the first conductive type substrate between the gate and the second conductive type source region. In an operation with normal bias, the voltage that allows the memory cell to have the maximum turn-on current is the $1^{st}$ voltage. The operation method includes to inject electrons or holes into a charge storage layer or to eject electrons or holes from a charge trapping layer by using one of channel hot electron injection, band-to-band tunneling induced hot hole injection, drain breakdown induced hot hole injection, channel hot carrier induced secondary carrier injection.

According to the operation method of a non-volatile memory in an exemplary embodiment of the present invention, the first conductive type is P-type, and the second conductive type is N-type.

The voltage levels described below comply with foregoing parameter.

According to the operation method of a non-volatile memory in an exemplary embodiment of the present invention, when electrons are injected into the charge storage layer by channel hot electron injection, a $2^{nd}$ voltage is supplied to the gate, a $3^{rd}$ voltage is supplied to the second conductive type drain region, and the second conductive type source region and the first conductive type substrate are grounded. The $2^{nd}$ voltage is higher than the $1^{st}$ voltage, and the $3^{rd}$ voltage is about 1.5~3 times of the $1^{st}$ voltage. The $2^{nd}$ voltage is about 3~7V, and the $3^{rd}$ voltage is about 3~7V.

According to the operation method of a non-volatile memory in an exemplary embodiment of the present invention, when holes are injected into the charge storage layer by band-to-band tunneling induced hot hole injection, a $4^{th}$ voltage is supplied to the gate, a $5^{th}$ voltage is supplied to the second conductive type drain region, the second conductive type source region is floated, and the first conductive type substrate is grounded. The $4^{th}$ voltage is lower than 0V, and the $5^{th}$ voltage is 1.5~3 times of the $1^{st}$ voltage. The $4^{th}$ voltage is about −3~−7V, and the $5^{th}$ voltage is about 3~7V.

According to the operation method of a non-volatile memory in an exemplary embodiment of the present invention, when holes are injected into the charge storage layer by drain breakdown induced hot hole injection, a $6^{th}$ voltage is supplied to the gate, a $7^{th}$ voltage is supplied to the second conductive type drain region, and a voltage of 0V is supplied to the second conductive type source region and the first conductive type substrate. The $6^{th}$ voltage is higher than the threshold voltage of the memory cell and lower than the $1^{st}$ voltage, and the $7^{th}$ voltage is 1.5~3 times of the $1^{st}$ voltage. The $6^{th}$ voltage is about 0.4~2V, and the $7^{th}$ voltage is about 3~7V.

According to the operation method of a non-volatile memory in an exemplary embodiment of the present invention, when electrons are injected into the charge storage layer by channel hot carrier induced secondary carrier injection, a $17^{th}$ voltage is supplied to the gate, a $18^{th}$ voltage is supplied to the second conductive type drain region, a $19^{th}$ voltage is supplied to the second conductive type source region, and a $20^{th}$ voltage is supplied to the first conductive type substrate. The $17^{th}$ voltage is higher than the $1^{st}$ voltage, the $18^{th}$ voltage is 1.5~3 times of the $1^{st}$ voltage, the $19^{th}$ voltage is between 0V and the $1^{st}$ voltage, and the $20^{th}$ voltage is lower than 0V.

The 17$^{th}$ voltage is about 3~7V, the 18$^{th}$ voltage is about 3~7V, the 19$^{th}$ voltage is about 0~2V, and the 20$^{th}$ voltage is about 0~−2V.

According to the operation method of a non-volatile memory in an exemplary embodiment of the present invention, the first conductive type is N-type, and the second conductive type is P-type.

According to the operation method of a non-volatile memory in an exemplary embodiment of the present invention, when electrons are injected into the charge storage layer by channel hot electron injection, an 8$^{th}$ voltage is supplied to the gate, a 9$^{th}$ voltage is supplied to the second conductive type drain region, and a voltage of 0V is supplied to the second conductive type source region and the first conductive type substrate. The 8$^{th}$ voltage is lower than or equal to the threshold voltage of the memory cell, and the 9$^{th}$ voltage is the negative of 1.5~3 times of the 1$^{st}$ voltage. The 8th voltage is about −3~−7V, and the 9$^{th}$ voltage is about −3~−7V.

According to the operation method of a non-volatile memory in an exemplary embodiment of the present invention, when electrons are injected into the charge storage layer by band-to-band tunneling induced hot hole injection, a 10$^{th}$ voltage is supplied to the gate, a 11$^{th}$ voltage is supplied to the second conductive type drain region, the second conductive type source region is floated, and a voltage of 0V is supplied to the first conductive type substrate. The 10$^{th}$ voltage is higher than 0V, and the 11$^{th}$ voltage is the negative of 1.5~3 times of the 1$^{st}$ voltage. The 10$^{th}$ voltage is about 3~7V, and the 11$^{th}$ voltage is about −3~−7V.

According to an exemplary embodiment of the present invention, the operation method of a non-volatile memory further includes supplying a 12$^{th}$ voltage to the gate, a 13$^{th}$ voltage to the second conductive type drain region, and a 14$^{th}$ voltage to the second conductive type source region when reading the memory cell, wherein the 12$^{th}$ voltage is equal to the 1$^{st}$ voltage.

According to the operation method of a non-volatile memory in an exemplary embodiment of the present invention, the 12$^{th}$ voltage is about 2.5V, the 13$^{th}$ voltage is about 1V, and the 14$^{th}$ voltage is about 0V.

According to the operation method of a non-volatile memory in an exemplary embodiment of the present invention, the 12$^{th}$ voltage is about 2.5V, the 13$^{th}$ voltage is about 0V or 0.5V, and the 14$^{th}$ voltage is about 1V or 1.5V.

According to an exemplary embodiment of the present invention, the operation method of a non-volatile memory further includes erasing the charges stored in the memory cell with high power radiation.

According to the operation method of a non-volatile memory in an exemplary embodiment of the present invention, the high power radiation includes ultraviolet radiation.

According to an exemplary embodiment of the present invention, the operation method of a non-volatile memory further includes erasing the charges stored in the memory cell by FN tunneling effect.

According to the operation method of a non-volatile memory in an exemplary embodiment of the present invention, when erasing the memory cell by Fowler-Nordheim (FN) tunneling effect, a 15$^{th}$ voltage is supplied to the gate, a 16$^{th}$ voltage is supplied to the second conductive type drain region, and the second conductive type source region and the first conductive type substrate are floated. The voltage difference between the 15$^{th}$ voltage and the 16$^{th}$ voltage may induce FN tunneling effect.

According to the operation method of a non-volatile memory in an exemplary embodiment of the present invention, the 15$^{th}$ voltage is about −6~−10V, and the 16$^{th}$ voltage is about 3~7V.

According to the operation method of a non-volatile memory in an exemplary embodiment of the present invention, the 15th voltage is about 6~10V, and the 16$^{th}$ voltage is about −3~−7V.

According to a non-volatile memory in the present invention, the charge storage layer of a memory cell is formed on the sidewall of the gate structure, which is different from the conventional technique that the oxide/nitride/oxide (ONO) layer of a silicon-oxide-nitride-oxide-silicon (SONOS) memory is formed below the gate. The structure in the present invention can greatly reduce the size of the device.

Moreover, the manufacturing method of non-volatile memory in the present invention can be integrated with a typical complementary metal-oxide semiconductor (CMOS) manufacturing process and no photolithography etching process of multiple masks is required, thus, the manufacturing time of a device can be shortened.

Furthermore, in a memory cell of the present invention, a lightly doped region of the same conductive type as that of the source region is formed at the source, and no lightly doped region is formed at the drain or the substrate at the drain is neutralized, or even a lightly doped region of the inverse conductive type as that of the drain region is formed at the drain. Thus, regardless right-reading or inverse reading, the turn-on current at reading the memory cell is smaller so that the device can have better performance.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. IF is a cross-sectional diagram of a non-volatile memory cell according to an exemplary embodiment of the present invention.

Figure 2A:
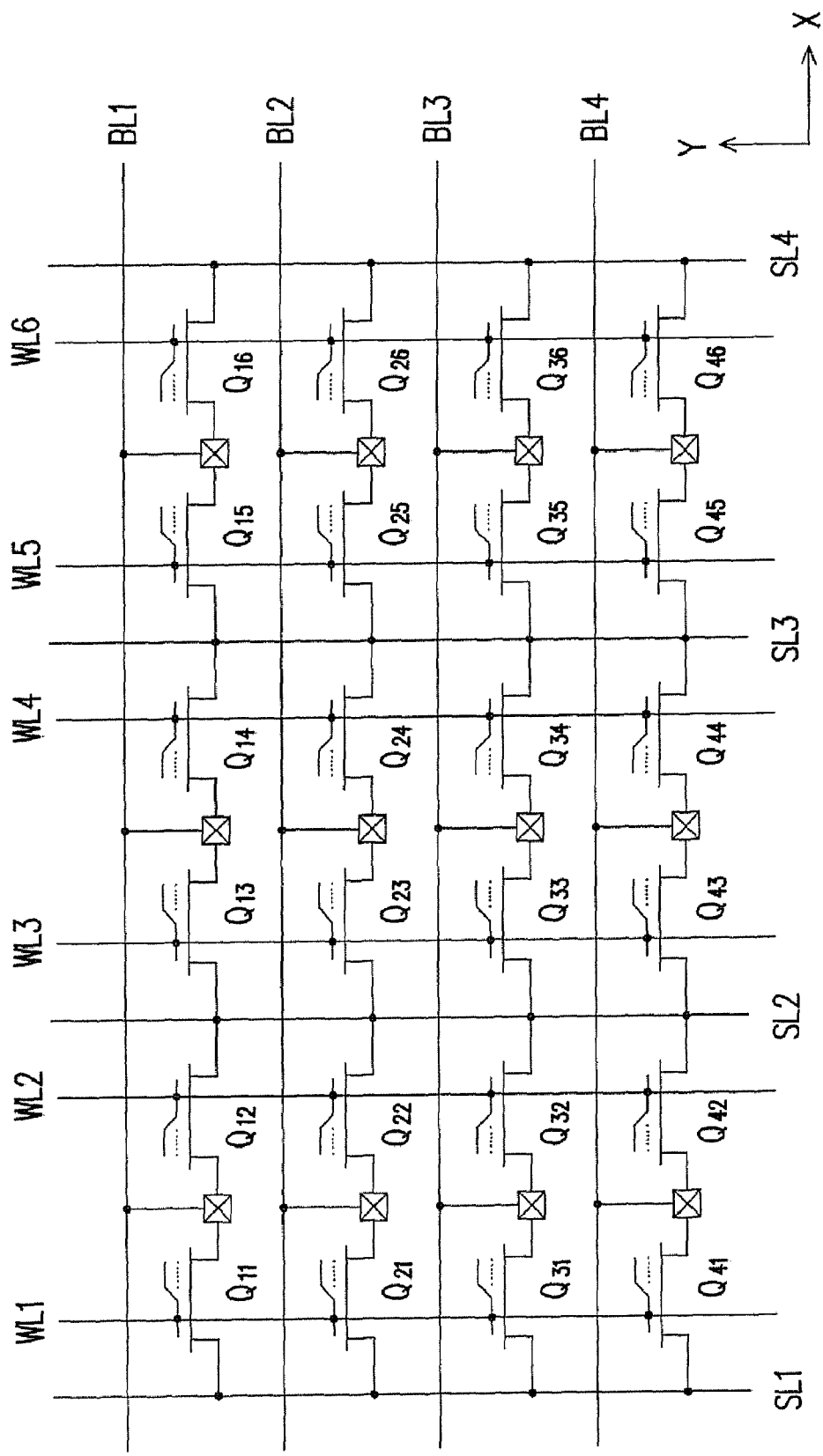

FIG. 2A is a simplified circuit diagram of a memory cell array composed of non-volatile memory cells according to an embodiment of the present invention.

Figure 2B:
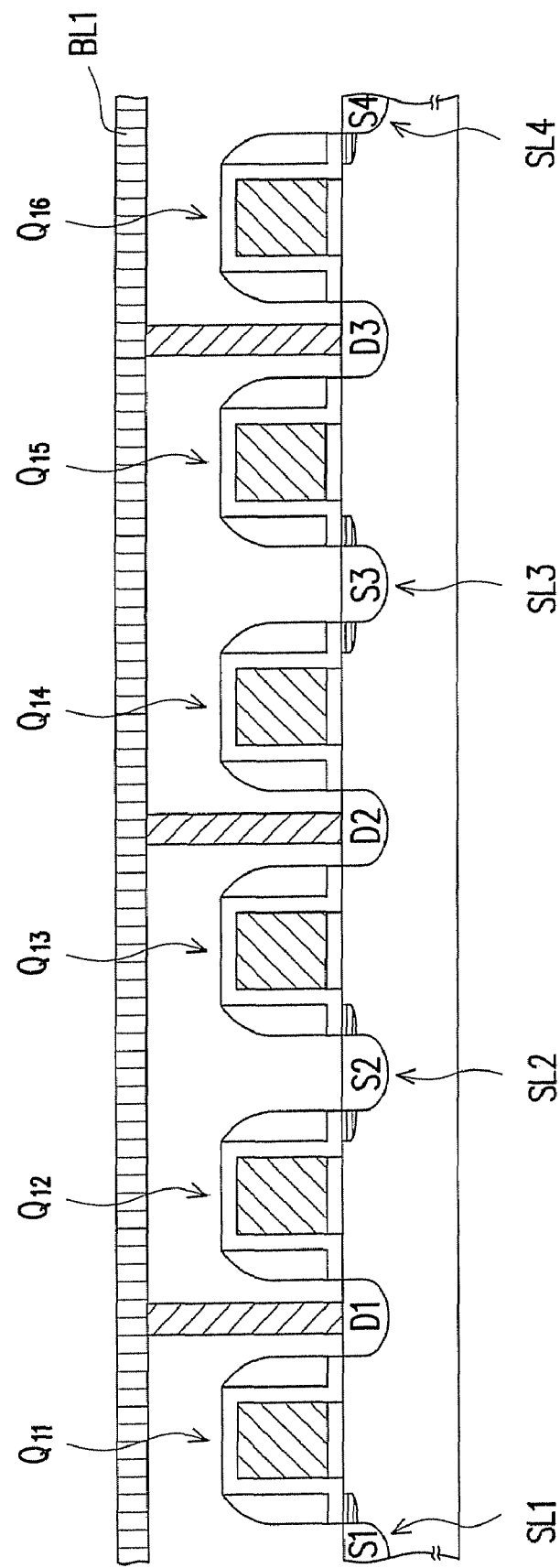

FIG. 2B is a cross-sectional diagram of the memory cells in the first row in FIG. 2A.

Figure 3A:
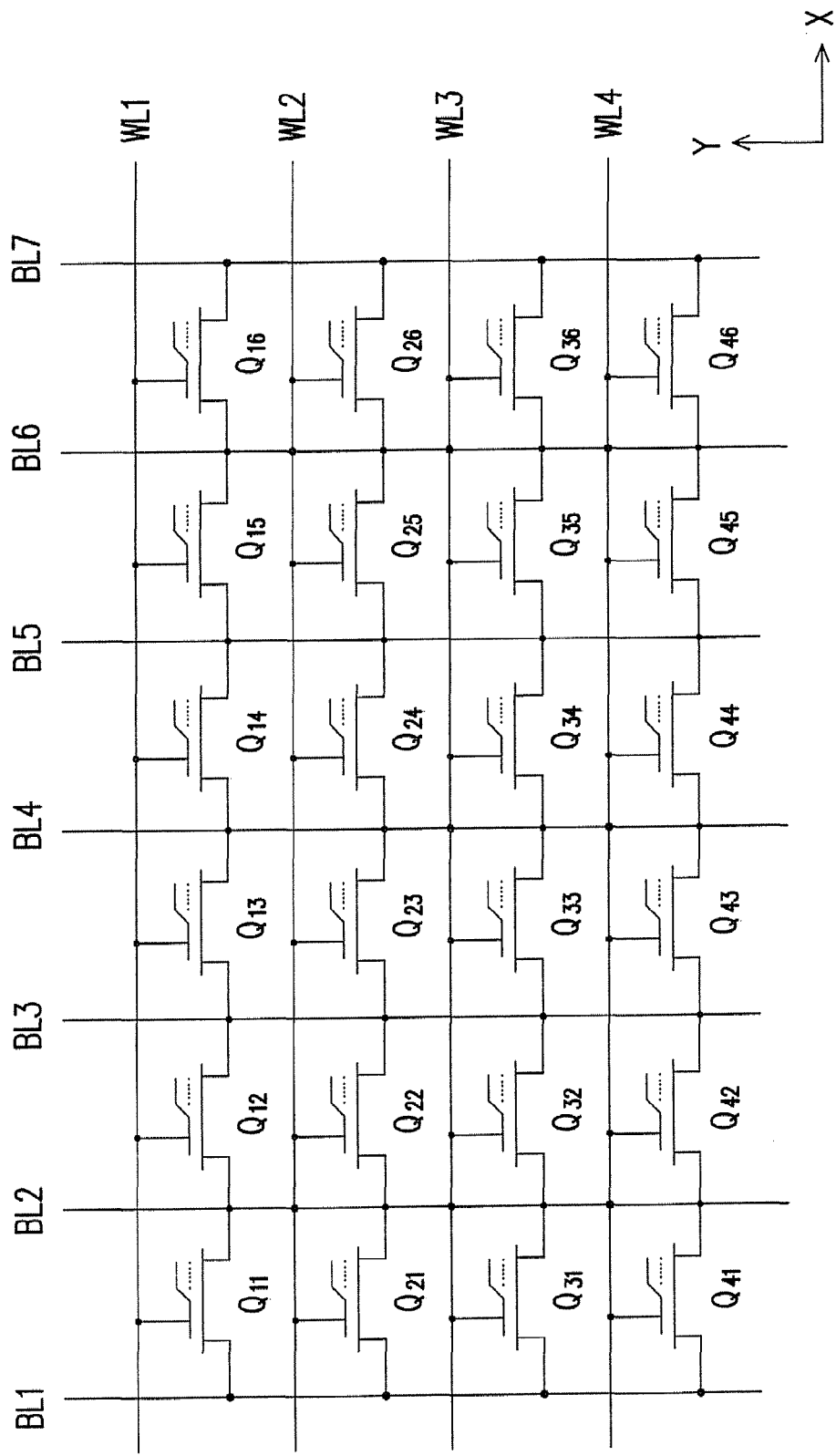

FIG. 3A is a simplified circuit diagram of a memory cell array composed of non-volatile memory cells according to an embodiment of the present invention.

Figure 3B:
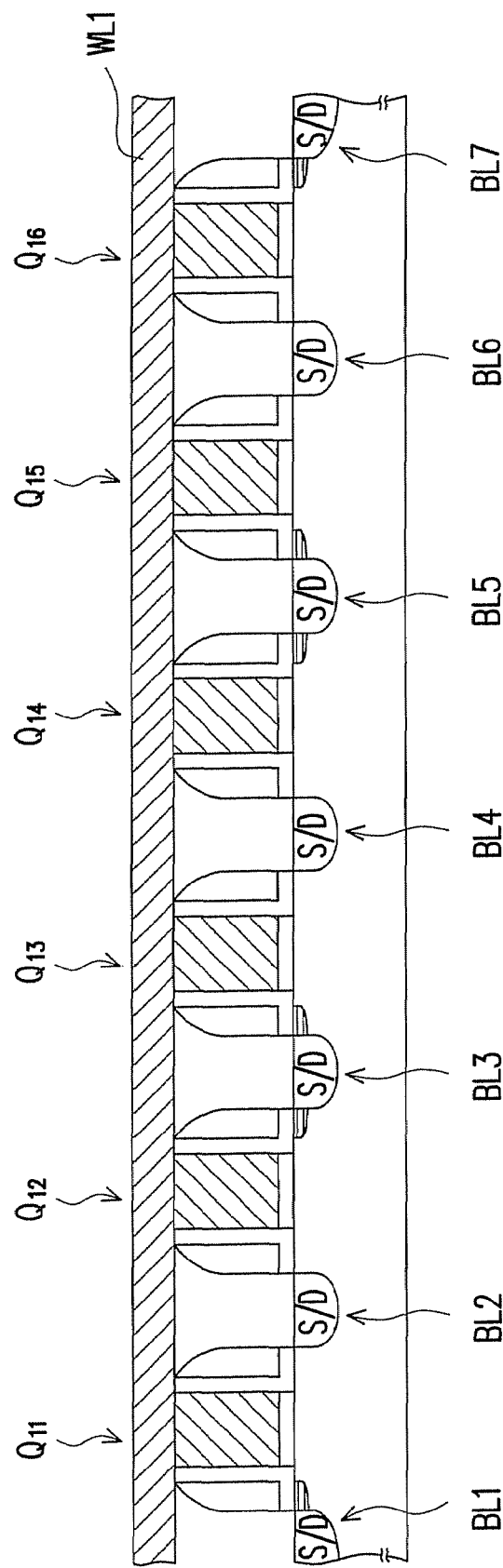

FIG. 3B is a cross-sectional diagram of the memory cells in the first row in FIG. 3A.

FIGS. 4A~4E are cross-sectional diagrams illustrating the manufacturing flow of a non-volatile memory according to an exemplary embodiment of the present invention.

Figure 5A:
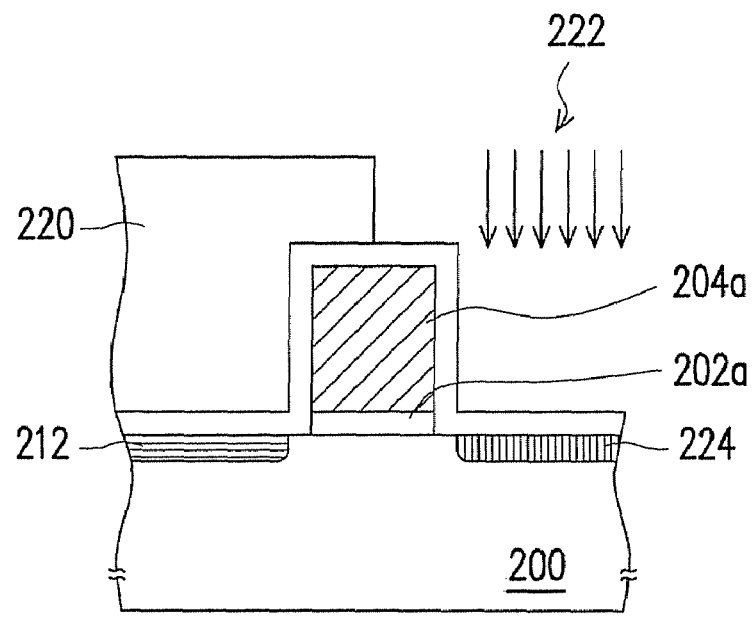
Figure 5B:
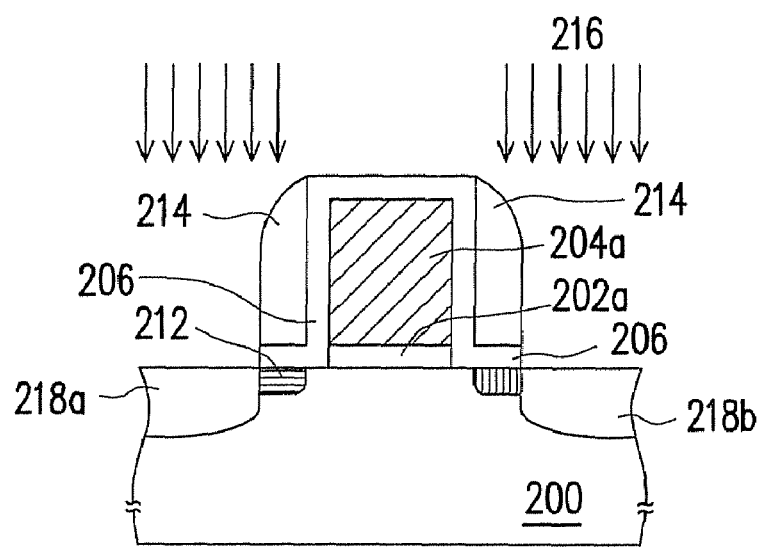

FIGS. 5A~5B are cross-sectional diagrams illustrating the manufacturing flow of a non-volatile memory according to an exemplary embodiment of the present invention.

Figure 6A:
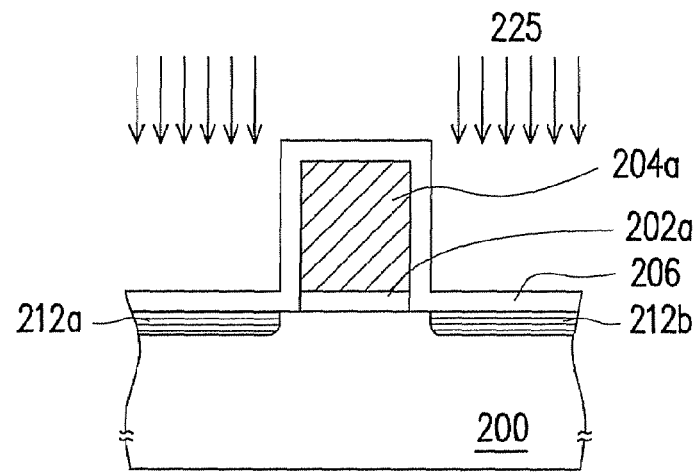
Figure 6B:
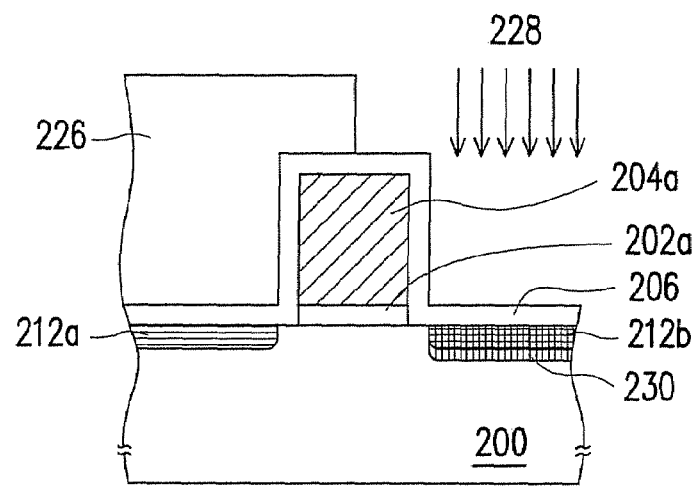
Figure 6C:
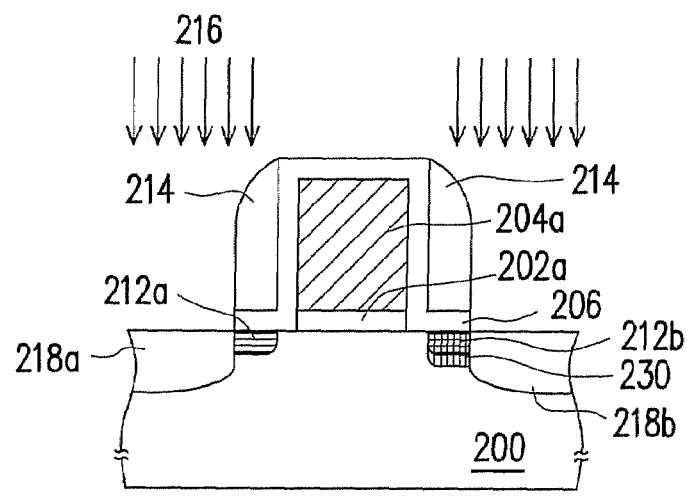

FIGS. 6A~6C are cross-sectional diagrams illustrating the manufacturing flow of a non-volatile memory according to an exemplary embodiment of the present invention.

FIGS. 7A~7D are cross-sectional diagrams illustrating the manufacturing flow of a non-volatile memory according to an exemplary embodiment of the present invention.

FIGS. 8A~8C and FIG. 8I are diagrams illustrating the operation of an N-type non-volatile memory.

Figure 8A:
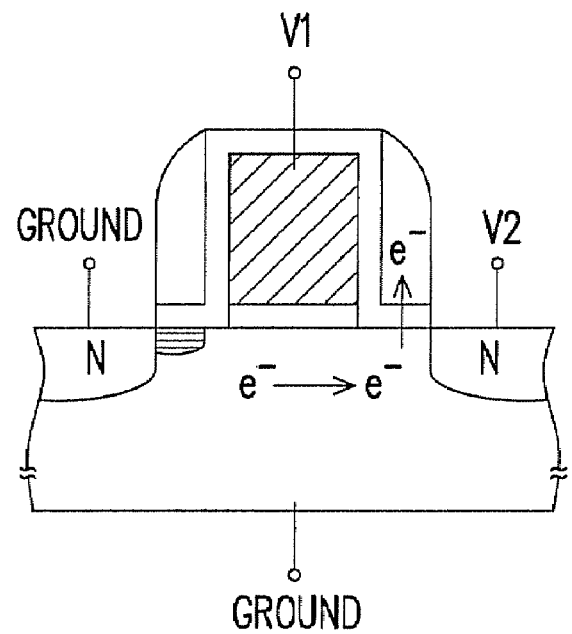
Figure 8B:
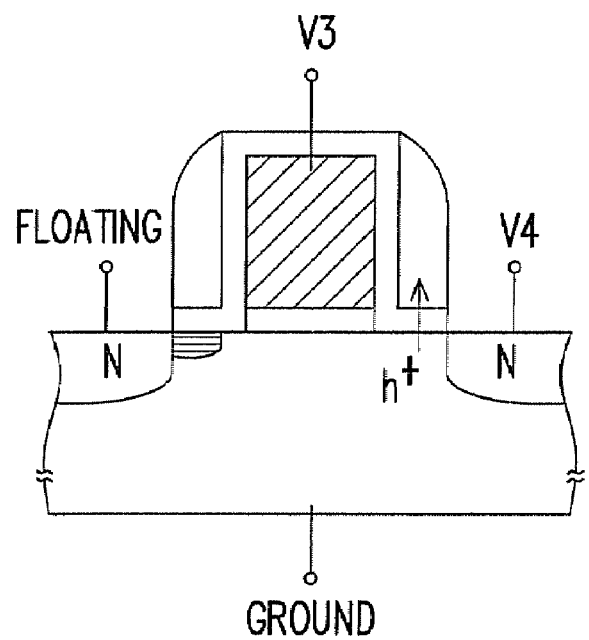
Figure 8C:
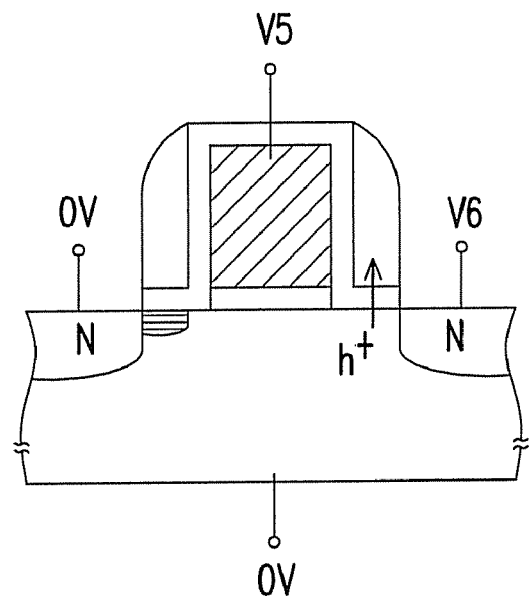
Figure 8D:
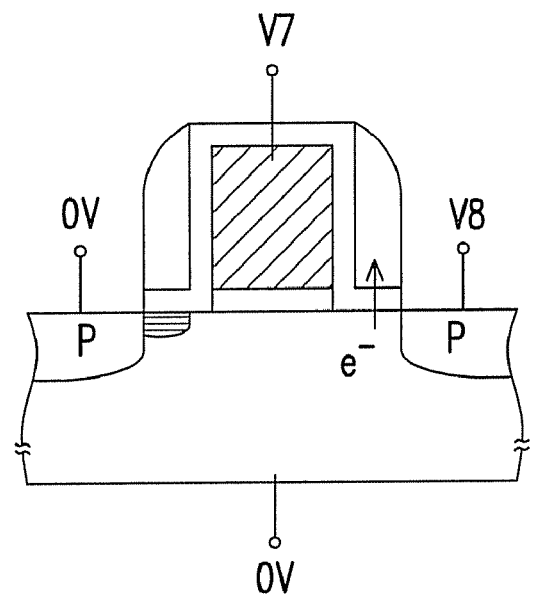
Figure 8E:
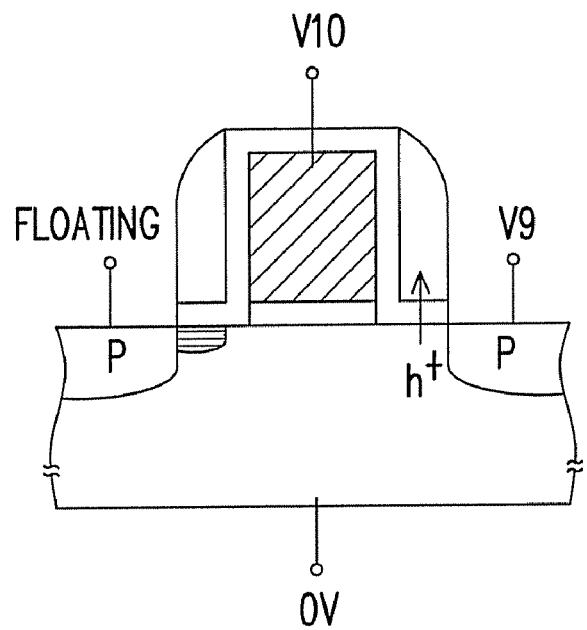

FIGS. 8D~8E are diagrams illustrating the operation of a P-type non-volatile memory.

Figure 8F:
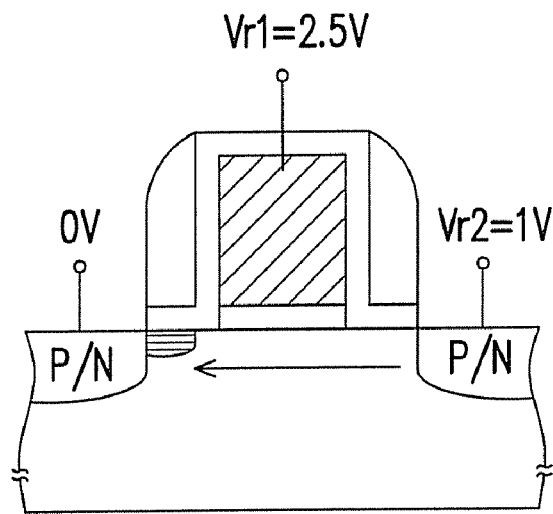

FIG. 8F is a diagram illustrating a right reading operation performed to a non-volatile memory according to an embodiment of the present invention.

Figure 8G:
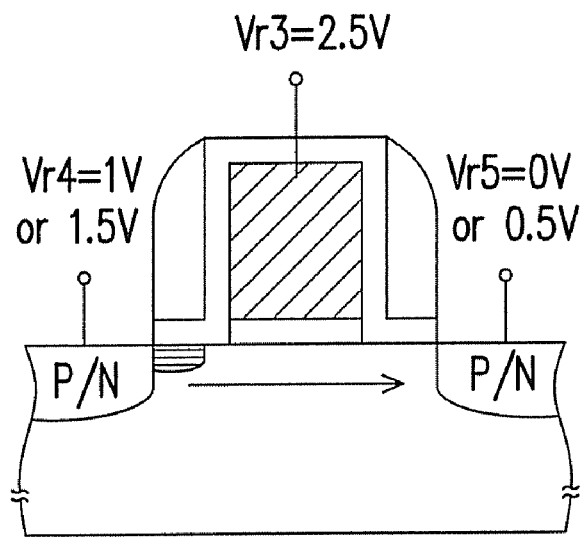

FIG. 8G is a diagram illustrating an inverse reading operation performed to a non-volatile memory according to an embodiment of the present invention.

Figure 8H:
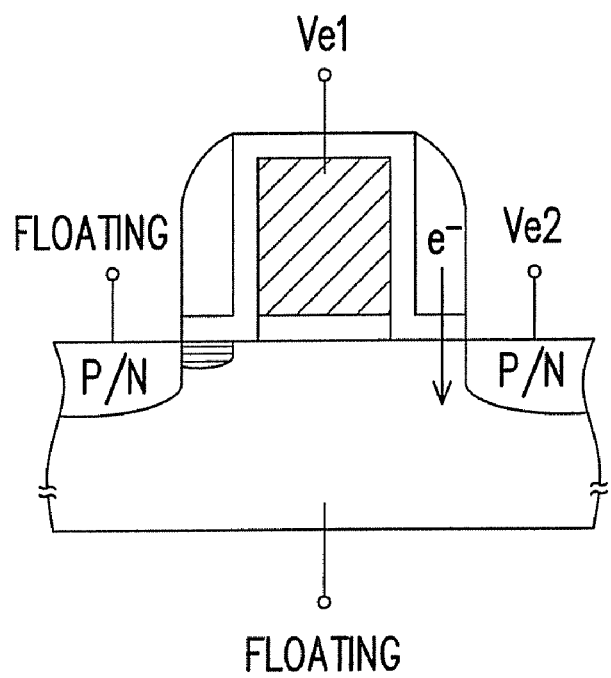

FIG. 8H is a diagram illustrating an erasing operation performed to a non-volatile memory according to an embodiment of the present invention.

DESCRIPTION OF EMBODIMENTS

Figure 1A:
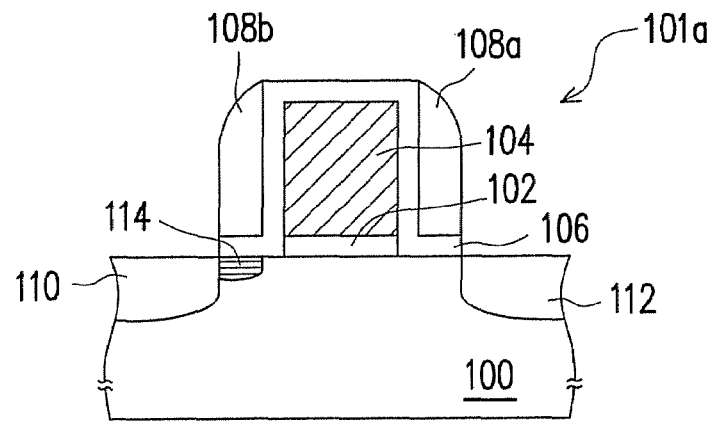
FIG. 1A is a cross-sectional diagram of a non-volatile memory cell according to an exemplary embodiment of the present invention.

FIG. 1A is a cross-sectional diagram of a non-volatile memory cell according to an exemplary embodiment of the present invention.

Referring to FIG. 1A, a memory cell 101a is, for example, formed on a first conductive type substrate 100. The first conductive type substrate 100 is, for example, a silicon substrate. The memory cell is, for example, composed of a gate dielectric layer 102, a gate 104, a dielectric layer 106, charge storage layers 108a and 108b, a second conductive type source region 110, a second conductive type drain region 112, and a second conductive type lightly doped region 114.

The gate 104 is, for example, formed on the first conductive type substrate 100. The material of the gate 104 is, for example, doped polysilicon.

The gate dielectric layer 102 is, for example, formed between the gate 104 and the first conductive type substrate 100. The material of the gate dielectric layer 102 is, for example, silicon oxide.

The second conductive type source region 110 and the second conductive type drain region 112 is, for example, formed in the first conductive type substrate at two sides of the gate 104.

The charge storage layers 108a and 108b is, for example, formed on the sidewall of the gate 104, wherein the charge storage layer 108a is formed on the substrate between the second conductive type drain region 112 and the gate 104, and the charge storage layer 108b is formed on the substrate between the second conductive type source region 112 and the gate 104. In the present embodiment, only the charge storage layer 108a is used for storing charges, while the charge storage layer 108b is not for storing charge but can be considered as an insulating spacer. The material of the charge storage layers 108a and 108b is, for example, silicon nitride. However, the material of the charge storage layers 108a and 108b is not limited to silicon nitride but may also be other material which can trap charges, such as SiON, TaO, $SrTiO_3$, or $HfO_2$.

The second conductive type lightly doped region 114 is, for example, formed in the first conductive type substrate 100 between the gate 104 and the second conductive type source region 110, namely, below the charge storage layer 108b.

In the embodiment described above, if the first conductive type is P-type, then the second conductive type is N-type, and the memory cell is a N-channel memory cell; if the first conductive type is N-type, then the second conductive type is P-type, and the memory cell is a P-channel memory cell.

In a memory cell of the present invention, since there is no second conductive type lightly doped region formed at the second conductive type drain region 112, the charge storage layer 108a can be used for storing charges. The second conductive type lightly doped region 114 is formed at the second conductive type source region 110, and then the charge storage layer 108b cannot be used for storing charges. The structure of the memory cell in the present invention is very simple and the manufacturing method can be integrated with a typical complimentary metal-oxide semiconductor (CMOS) manufacturing process.

Figure 1B:
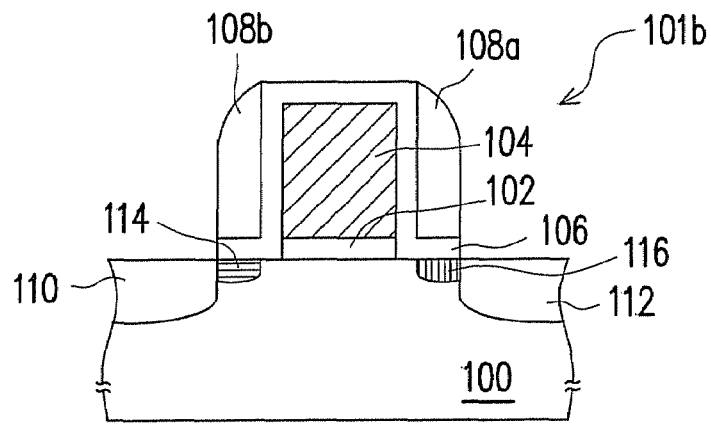
FIG. 1B is a cross-sectional diagram of a non-volatile memory cell according to an exemplary embodiment of the present invention.

FIG. 1B is a cross-sectional diagram of a non-volatile memory cell according to another exemplary embodiment of the present invention. In FIG. 1B, the components same as those in FIG. 1A have the same reference numerals and the descriptions thereof are skipped herein. Only the differences between the two will be described below.

Referring to FIG. 1B, the memory cell 101b includes a first conductive type lightly doped region 116 formed at the second conductive type drain region 112. The first conductive type lightly doped region 116 is, for example, formed in the first conductive type substrate 100 between the gate 104 and the second conductive type drain region 112, namely, below the charge storage layer 108a.

In the memory cell 101b shown in FIG. 1B, a lightly doped region of the conductive type inverse to that of the source/drain region is formed at the drain, and which helps to inject carriers into the charge storage layer 108a.

Figure 1C:
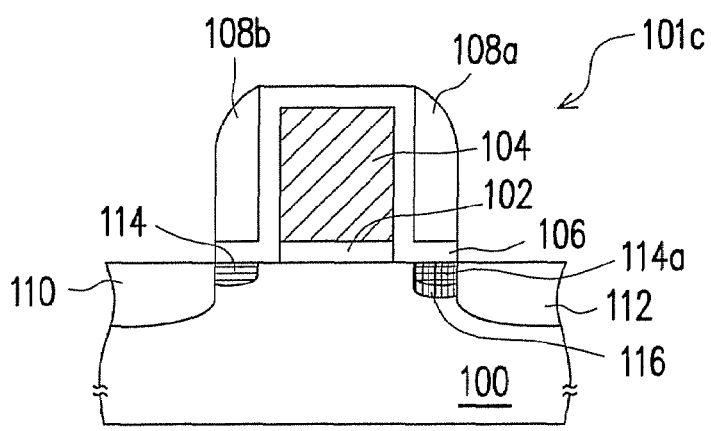
FIG. 1C is a cross-sectional diagram of a non-volatile memory cell according to an exemplary embodiment of the present invention.

FIG. 1C is a cross-sectional diagram of a non-volatile memory cell according to yet another exemplary embodiment of the present invention. In FIG. 1C, the components same as those in FIG. 1A have the same reference numerals and the descriptions thereof are skipped herein. Only the differences between the two will be described below.

Referring to FIG. 1C, the memory cell 101c includes a second conductive type lightly doped region 114a and a first conductive type lightly doped region 116 formed at the second conductive type drain region 112. The first conductive type lightly doped region 116 is, for example, formed in the first conductive type substrate 100 between the gate 104 and the second conductive type drain region 112, namely, below the charge storage layer 108a. The second conductive type lightly doped region 114a is, for example, formed in the first conductive type substrate 100 between the gate 104 and the second conductive type drain region 112, namely below the charge storage layer 108a.

In the memory cell 101c shown in FIG. 1C, since a second conductive type lightly doped region 114a and a first conductive type lightly doped region 116 of inverse conductive types are formed at the drain, the substrate 100 below the charge storage layer 108a can be maintained to the first conductive type, and which helps to inject carriers into the charge storage layer 108a.

Figure 1D:
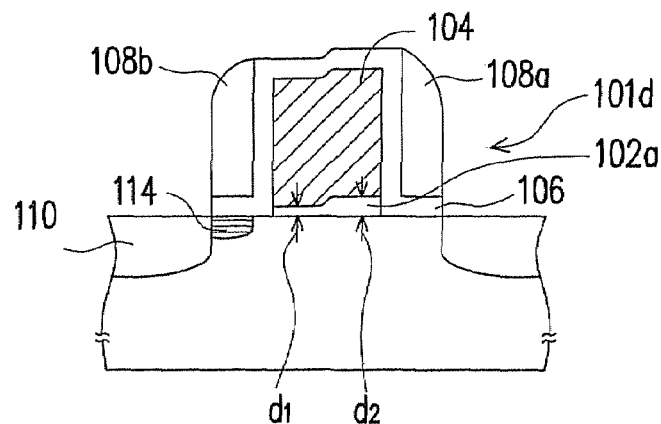
FIG. 1D is a cross-sectional diagram of a non-volatile memory cell according to an exemplary embodiment of the present invention.

FIG. 1D is a cross-sectional diagram of a non-volatile memory cell according to yet another exemplary embodiment of the present invention. In FIG. 1D, the components same as those in FIG. 1A have the same reference numerals and the descriptions thereof are skipped herein. Only the differences between the two will be described below.

Referring to FIG. 1D, the gate dielectric layer 102a between the gate 104 and the first conductive type substrate 100 has different thicknesses at where close to the second conductive type drain region 112 and the second conductive type source region 110. For example, the thickness of the gate dielectric layer 102a at where close to the second conductive type source region 110 is d1, and the thickness of the gate dielectric layer 102a at where close to the second conductive type drain region 112 is d2, wherein d2 is greater than d1.

In the memory cell 101d as shown in FIG. 1D, the gate dielectric layer 102a at where close to the second conductive type drain region 112 is thicker and accordingly can resist higher voltage, thus, the problem of the gate dielectric layer being damaged when a high voltage is supplied to the drain can be resolved.

Figure 1E:
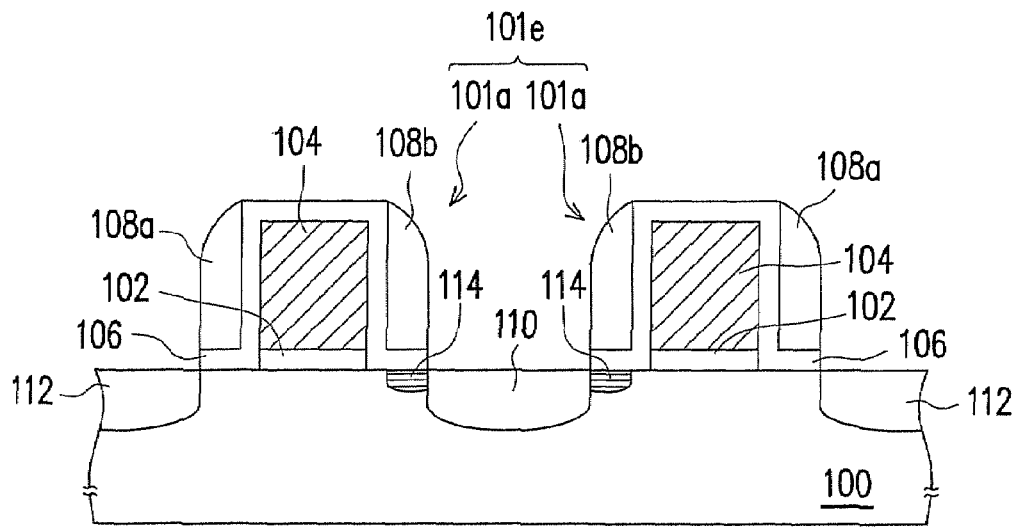
FIG. 1E is a cross-sectional diagram of a non-volatile memory cell according to an exemplary embodiment of the present invention.

FIG. 1E is a cross-sectional diagram of a non-volatile memory cell according to yet another exemplary embodiment of the present invention. In FIG. 1E, the components same as those in FIG. 1A have the same reference numerals and the descriptions thereof are skipped herein. Only the differences between the two will be described below.

As shown in FIG. 1E, the memory unit 101e is, for example, composed of two memory cells 101a formed in symmetric manner. Namely, two adjacent memory cells 101a share a second conductive type source region 110.

Since two memory cells share one second conductive type source region 110, the device integration can be increased. A memory unit 101e composed of two memory cells 101a is illustrated in FIG. 1E, however, the memory unit 101e may also be composed of two memory cells 101b~101d in FIG. 1B~FIG. 1D formed in symmetric manner.

Figure 1F:
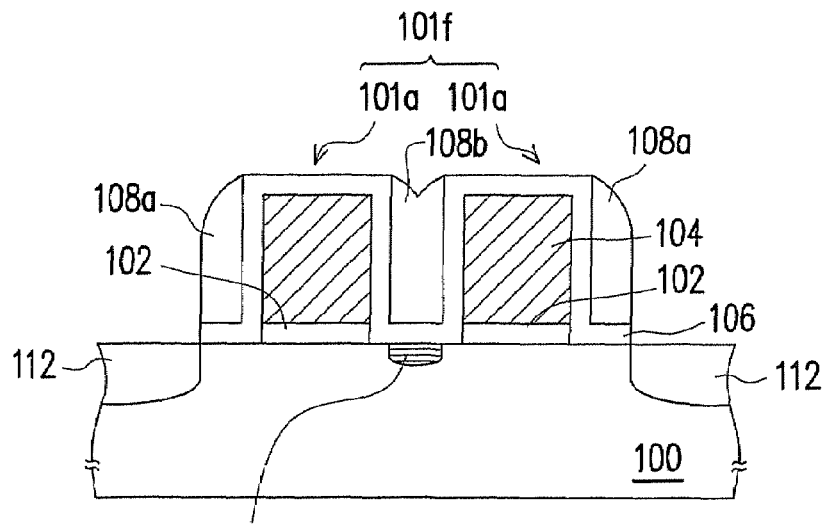

FIG. 1F is a cross-sectional diagram of a non-volatile memory cell according to yet another exemplary embodiment of the present invention. In FIG. 1F, the components same as those in FIG. 1E have the same reference numerals and the descriptions thereof are skipped herein. Only the differences between the two will be described below.

As shown in FIG. 1F, the memory unit 101f is, for example, composed of two memory cells 101a formed in symmetric manner. However, the two memory cells 101a are very close to each other so that no second conductive type source region 110 is formed, but the two memory cells 101a share a second conductive type lightly doped region 114. Since no second conductive type source region 110 is formed between the two memory cells 101a, the device integration can be further increased.

In the non-volatile memory of the present invention, the charge storage layer is formed on the sidewall of the gate structure, and which is different from that the oxide/nitride/oxide (ONO) layer of a conventional SONOS memory is formed below the gate. The structure in the present invention can greatly reduce device size. The manufacturing process of the non-volatile memory in the present invention is simple and no photolithography process of multiple masks is required, furthermore, the process can be integrated with a typical CMOS process, thus, the manufacturing time of device can be shortened. Besides, the second conductive type drain regions 112 in the non-volatile memories in FIGS. 1A~1F do not have to be self aligned to the gate.

FIG. 2A is a simplified circuit diagram of a memory cell array composed of non-volatile memory cells according to an embodiment of the present invention. FIG. 2B is a cross-sectional diagram of the memory cells in the first row in FIG. 2A.

As shown in FIGS. 2A and 2B, the memory cell array is, for example, composed of memory cells Q11~Q46, a plurality of source lines SL1~SL4, a plurality of bit lines BL1~BL4, and a plurality of word lines WL1~WL6. The structures of the memory cells Q11~Q46 are as shown in FIGS. 1A~1D. The memory cell illustrated in FIG. 1A is described as an example in FIG. 2B.

The memory cells Q11~Q46 are arranged as an array. The memory cells Q11~Q16 are, for example, formed in symmetric manner in direction X (the direction of rows). Two adjacent memory cells among memory cells Q11~Q16 share one source region S or one drain region D. For example, the memory cells Q11 land Q12 share the drain region D1, the memory cells Q13 and Q14 share the drain region D2, and the memory cells Q15 and Q16 share the drain region D3. The memory cells Q12 and Q13 share the source region S2, and the memory cells Q14 and Q15 share the source region S3.

The source lines SL1~SL4 are arranged in parallel in direction Y (the direction of columns) and connect the source regions of the memory cells in the same column. For example, the source line SL1 connects the source regions of the memory cells Q11~Q41, the source line SL2 connects the source regions of the memory cells Q12~Q41 and the memory cells Q13~Q43, ..., the source line SL4 connects the source regions of the memory cells Q16~Q46.

The bit lines BL1~BL4 are arranged in parallel in direction X (the direction of rows) and connect the drain regions of the memory cells in the same row. For example, the bit line BL1 connects the drain regions of the memory cells Q11~Q16, the bit line BL2 connects the drain regions of the memory cells Q21~Q26, ..., the bit lines BL4 connects the drain regions of the memory cells Q41~Q46.

The word lines WL1~WL6 are arranged in parallel in the direction of columns and connect the gates of the memory cells in the same column. For example, the word line WL1 connects the gates of the memory cells Q11~Q41, the word line WL2 connects the gates of the memory cells Q12~Q42, ..., the word line WL6 connects the gate of the memory cells Q16~Q46.

FIG. 3A is a simplified circuit diagram of a memory cell array composed of non-volatile memory cells according to another embodiment of the present invention. FIG. 3B is a cross-sectional diagram of the memory cells in the first row in FIG. 3A.

As shown in FIG. 3A and FIG. 3B, the memory cell array is, for example, composed of memory cells Q11~Q46, a plurality of bit lines BL1~BL7, and a plurality of word lines WL1~WL6. The structures of the memory cells Q11~Q46 are as illustrated in FIGS. 1A~1D. The memory cell illustrated in FIG. 1A is described as an example in FIG. 3B.

The memory cells Q11~Q46 are arranged as an array. In direction X (the direction of rows), the memory cells Q11~Q16 are, for example, connected in series, the memory cells Q21~Q26 are, for example, connected in series, ..., the memory cells Q41~Q46 are, for example, connected in series. Here series connection refers to that the source region of a memory cell is connected to the drain region of the previous adjacent memory cell, and the drain region of the memory cell is connected to the source region of the next memory cell. That is, in the direction of rows, two adjacent memory cells share one doped region S/D, and the S/D is used as the source region of a memory cell and the drain region of the other memory cell.

The bit lines BL1~BL7 are arranged in parallel in direction Y (the direction of columns) and connect the doped regions S/D in the same column. For example, the bit line BL1 connects the doped regions S/D at one side of the memory cells Q11~Q41, the bit line BL2 connects the doped regions S/D between the memory cells Q12~Q42 and the memory cells Q13~Q42, . . . , the bit line BL6 connects the doped regions S/D between the memory cells Q15~Q45 and the memory cells Q16~Q46, the bit line BL7 connects the doped regions S/D at the other side of the memory cells Q16~Q46.

The word lines WL1~WL6 are arranged in parallel in the direction of rows and connect the gates of the memory cells in the same row. For example, the word line WL1 connects the gates of the memory cells Q11~Q16, the word line WL2 connects the gates of the memory cells Q21~Q26, . . . , the word line WL4 connects the gates of the memory cells Q41~Q46.

In a memory cell array of the present invention, the charge storage layers of the memory cells Q11~Q46 are formed on the sidewalls of the gates, and such structure can greatly reduce device size. The manufacturing process is very simple and no photolithography process of multiple masks is required, further more, the manufacturing process can be integrated with a typical CMOS process, so that the manufacturing time of the device can be shortened.

Next, the manufacturing method of a non-volatile memory in the present invention will be described. FIGS. 4A~4E are cross-sectional diagrams illustrating the manufacturing flow of a non-volatile memory according to an exemplary embodiment of the present invention.

Figure 4A:
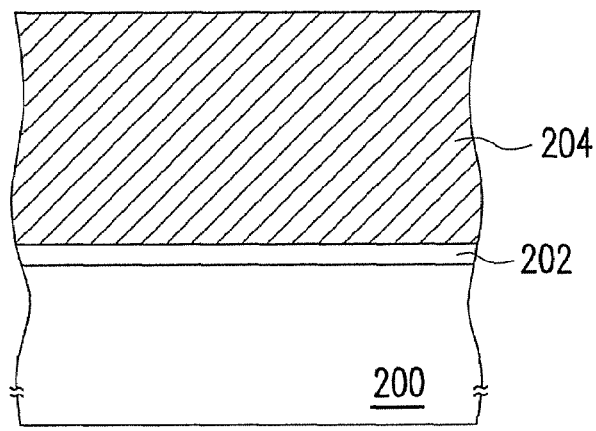

Referring to FIG. 4A, first, a first conductive type substrate 200 is provided and a dielectric layer 202 and a conductive layer 204 are formed on the substrate 200. The first conductive type substrate 200 is, for example, a silicon substrate. The material of the dielectric layer 202 is, for example, silicon oxide, and the formation method thereof is, for example, thermal oxidation. The material of the conductive layer 204 is, for example, doped polysilicon, and the formation method thereof is, for example, forming a layer of undoped polysilicon by chemical vapor deposition first and then performing ion implantation to form the conductive layer 204, or performing chemical vapor deposition with in-situ dopant implantation to form the conductive layer 204.

Figure 4B:
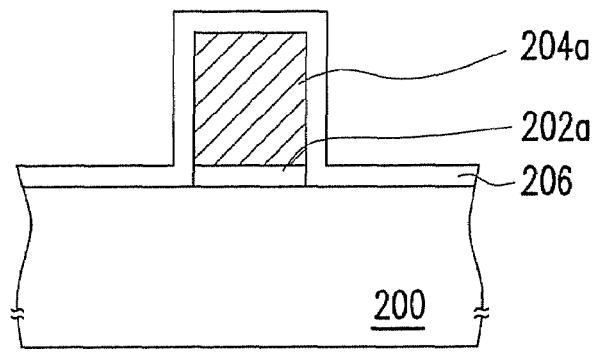

Referring to FIG. 4B, the conductive layer 204 and the dielectric layer 202 are patterned to form a gate 204a and a gate dielectric layer 202a. The method of patterning the conductive layer 204 and the dielectric layer 202 is, for example, photolithography etching technique. A dielectric layer 206 is then formed on the substrate 200. The material of the dielectric layer 206 is, for example, silicon oxide, and the formation method thereof is, for example, thermal oxidation or chemical vapor deposition.

Figure 4C:
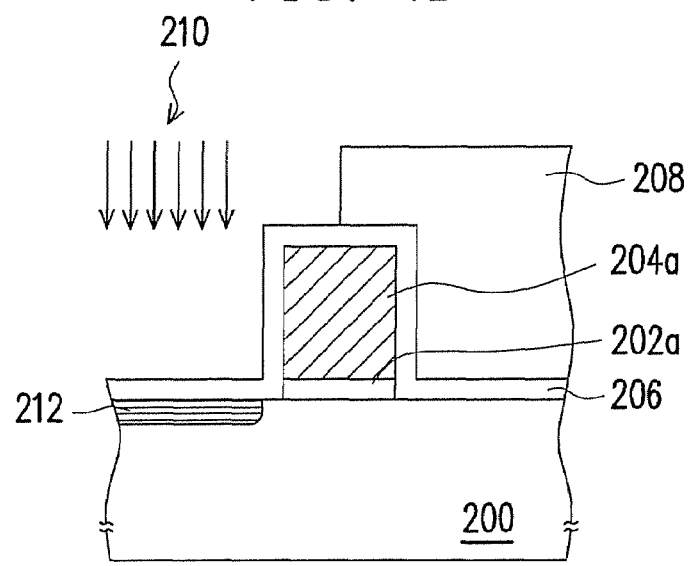

Referring to FIG. 4C, a patterned photoresist layer 208 is formed on the substrate 200, and the patterned photoresist layer 208 exposes the substrate 200 at one side of the gate 204a. The patterned photoresist layer 208 is, for example, formed with photolithography technique. Next, a dopant implantation step 210 is performed with the patterned photoresist layer 208 as a mask to form a second conductive type lightly doped region 212 in the substrate 200. The dopant implantation step 210 is, for example, to implant dopants into the substrate 200 by ion implantation.

Figure 4D:
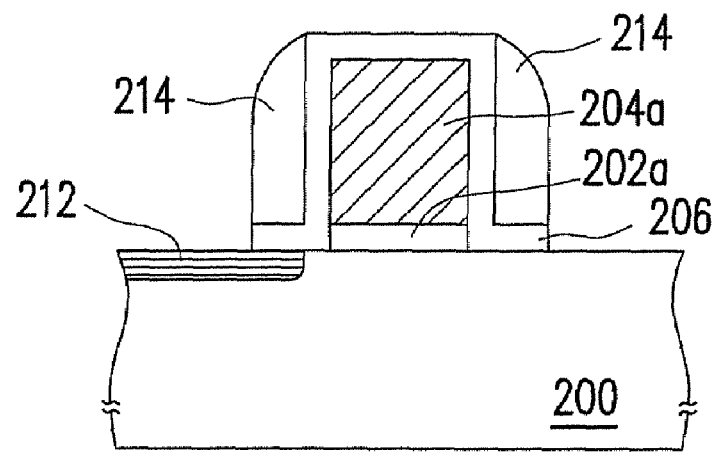

Referring to FIG. 4D, a charge storage layer 214 is formed on the sidewall of the gate 204 after the patterned photoresist layer 208 is removed. The material of the charge storage layer 214 is, for example, silicon nitride, SiON, TaO, $SrTiO_3$, or $HfO_2$. The formation method of the charge storage layer 214 is, for example, forming a charge storage material layer by chemical vapor deposition first and then removing part of the charge storage material layer by performing an anisotropic etching process.

Figure 4E:
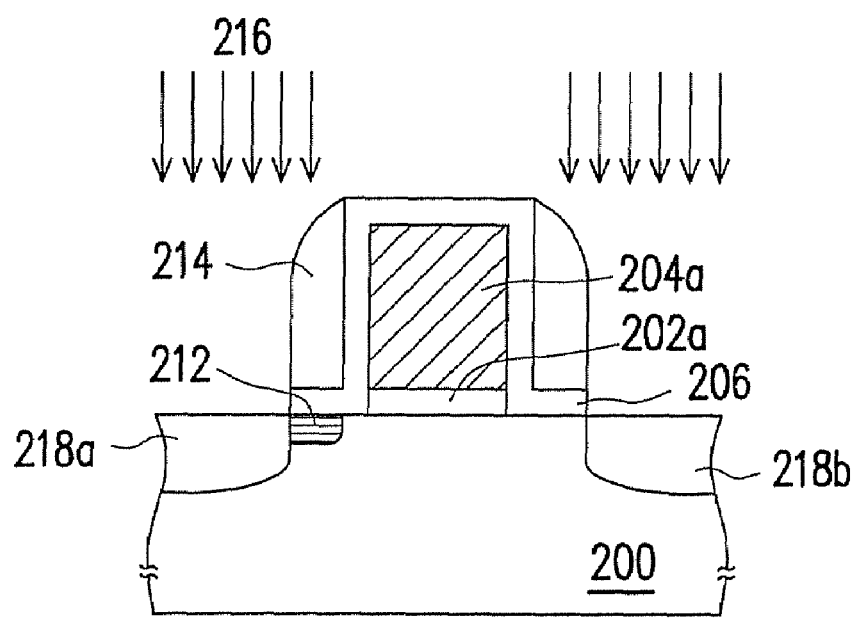

Referring to FIG. 4E, a dopant implantation step 216 is then performed with the gate 204a having the charge storage layer 214 as a mask to form a second conductive type source region 218a and a second conductive type drain region 218b in the substrate 200. The dopant implantation step 216 is, for example, to implant dopant into the substrate 200 by ion implantation.

FIGS. 5A~5B are cross-sectional diagrams illustrating the manufacturing flow of a non-volatile memory according to another exemplary embodiment of the present invention. The components in FIGS. 5A~5B same as those in FIGS. 4A~4E have the same reference numerals and the descriptions thereof are skipped herein.

Referring to FIG. 5A, following the steps in FIG. 4C, the patterned photoresist layer 208 is removed after the second conductive type lightly doped region 212 is formed in the substrate 200. Next, another patterned photoresist layer 220 is formed on the substrate 200, and the patterned photoresist layer 220 exposes the substrate 200 at the other side (the side opposite to the second conductive type lightly doped region 212) of the gate 204a. The patterned photoresist layer 220 is, for example, formed with photolithography technique. After that, a dopant implantation step 222 is performed with the patterned photoresist layer 220 as a mask to form a first conductive type lightly doped region 224 in the substrate 200. The dopant implantation step 222 is, for example, to implant dopant into the substrate 200 by ion implantation.

Referring to FIG. 5B, a charge storage layer 214 is formed on the sidewall of the gate 204 after the patterned photoresist layer 220 is removed. Then a dopant implantation step 216 is performed with the gate 204a having the charge storage layer 214 as a mask to form a second conductive type source region 218a and a second conductive type drain region 218b in the substrate 200.

FIGS. 6A~6C are cross-sectional diagrams illustrating the manufacturing flow of a non-volatile memory according to yet another exemplary embodiment of the present invention. The components in FIGS. 6A~6C same as those in FIGS. 4A~4E have the same reference numerals and the descriptions thereof are skipped herein.

Referring to FIG. 6A, following the steps in FIG. 4B, after the gate 204a, the gate dielectric layer 202a, and the dielectric layer 206 are formed on the substrate 200, a dopant implantation step 225 is performed with the gate 204a as a mask to form second conductive type lightly doped regions 212a and 212b in the substrate 200 at two sides of the gate 204a. The dopant implantation step 225 is, for example, to implant dopant into the substrate 200 by ion implantation.

Referring to FIG. 6B, a patterned photoresist layer 226 is formed on the substrate 200, and the patterned photoresist layer 226 exposes the substrate 200 at one side of the gate 204a. The patterned photoresist layer 226 is, for example, formed with photolithography technique. Then, a dopant implantation step 228 is performed with the patterned photoresist layer 226 as a mask to form a first conductive type lightly doped region 230 in the substrate 200. The dopant implantation step 228 is, for example, to implant dopant into the substrate 200 by ion implantation.

Referring to FIG. 6C, a charge storage layer 214 is formed on the sidewall of the gate 204 after the patterned photoresist layer 226 is removed. Then, a dopant implantation step 216 is performed with the gate 204a having the charge storage layer 214 as a mask to form a second conductive type source region 218a and a second conductive type drain region 218b in the substrate 200.

FIGS. 7A~7D are cross-sectional diagrams illustrating the manufacturing flow of a non-volatile memory according to an exemplary embodiment of the present invention. The components in FIGS. 7A~7D same as those in FIGS. 4A~4E have the same reference numerals and the descriptions thereof are skipped herein.

Figure 7A:
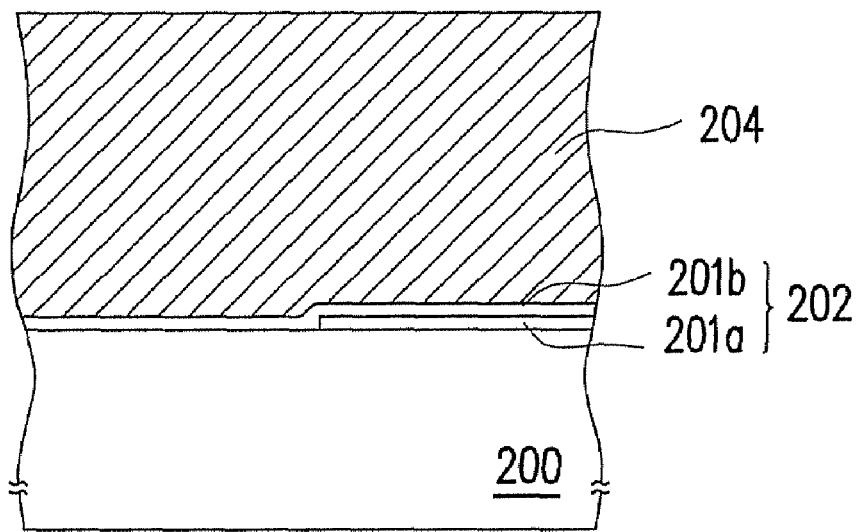

Referring to FIG. 7A, first, a first conductive type substrate 200 is provided, and a dielectric layer 202 and a conductive layer 204 are formed on the substrate 200. The first conductive type substrate 200 is, for example, a silicon substrate. The dielectric layer 202 is, for example, composed of a dielectric layer 201a and a dielectric layer 201b. Thus, the dielectric layer 202 has two different thicknesses. The material of the dielectric layer 202 is, for example, silicon oxide. The formation method of the dielectric layer 202 is, for example, forming a dielectric layer on the substrate 200 first, then patterning the dielectric layer to form the dielectric layer 201a, and after that forming the dielectric layer 201b on the substrate 200. The material of the conductive layer 204 is, for example, doped polysilicon, and the formation method thereof is, for example, forming a layer of undoped polysilicon by performing chemical vapor deposition first, and then performing ion implantation to form the conductive layer 204, or performing chemical vapor deposition with in-situ dopant implantation to form the conductive layer 204.

Figure 7B:
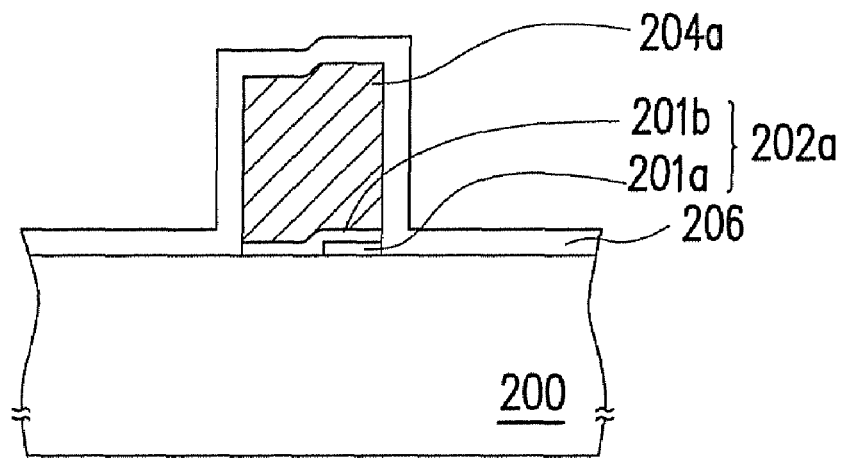

Referring to FIG. 7B, the conductive layer 204 and the dielectric layer 202 are patterned to form the gate 204a and the gate dielectric layer 202a. The method of patterning the conductive layer 204 and the dielectric layer 202 is, for example, photolithography etching technique. A dielectric layer 206 is then formed on the substrate 200. The material of the dielectric layer 206 is, for example, silicon oxide, and the formation method thereof is, for example, thermal oxidation or chemical vapor deposition.

Figure 7C:
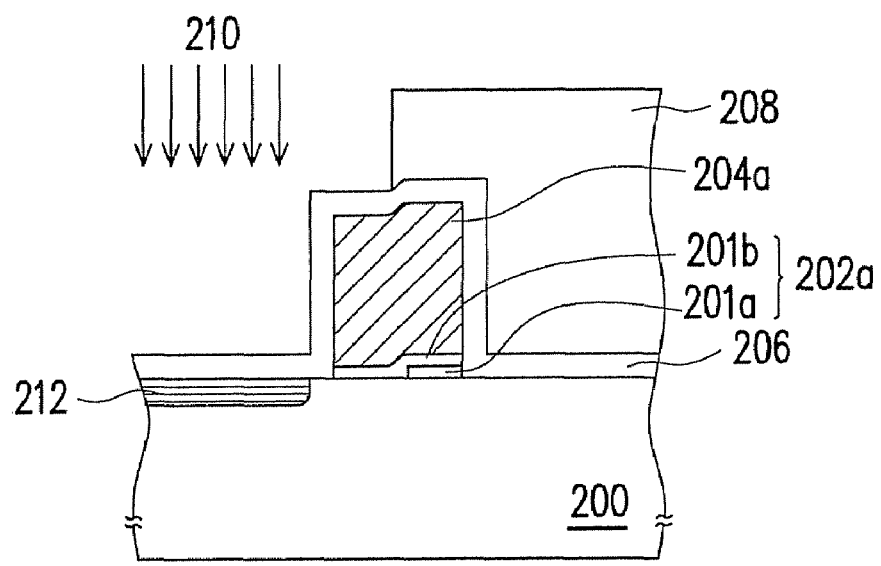

Referring to FIG. 7C a patterned photoresist layer 208 is formed on the substrate 200, and the patterned photoresist layer 208 exposes the substrate 200 at one side of the gate 204a. The patterned photoresist layer 208 is, for example, formed with photolithography technique. Then, a dopant implantation step 210 is performed with the patterned photoresist layer 208 as a mask to form a second conductive type lightly doped region 212 in the substrate 200. The second conductive type lightly doped region 212 is formed at the thinner side of the dielectric layer 202a. The dopant implantation step 210 is, for example, to implant dopant into the substrate 200 by ion implantation.

Figure 7D:
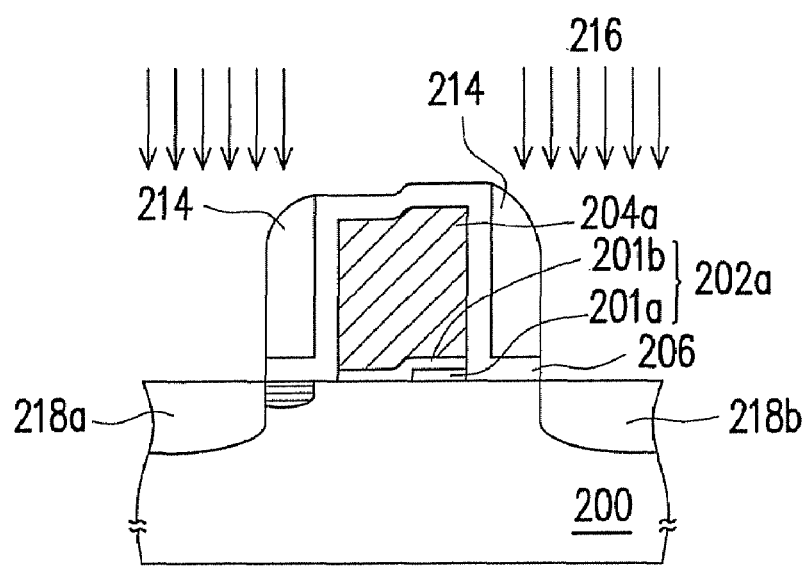

Referring to FIG. 7D, a charge storage layer 214 is formed on the sidewall of the gate 204 after the patterned photoresist layer 208 is removed. Then, a dopant implantation step 216 is performed with the gate 204a having the charge storage layer 214 as a mask to form a second conductive type source region 218a and a second conductive type drain region 218b in the substrate 200. The dopant implantation step 216 is, for example, implanting dopants into the substrate 200 by ion implantation. The fabricating method of the lightly doped regions in FIGS. 7A~7D may also adopt the methods described in the embodiments of FIGS. 5A~5B and FIGS. 6A~6C.

According to the manufacturing method of non-volatile memory in the present invention, the charge storage layer is formed on the sidewall of the gate structure, and which is very different from the conventional technique that the ONO layer of a SONOS memory is formed below the gate. Thus, the manufacturing method of non-volatile memory in the present invention can be integrated with a typical CMOS process and can shorten the time required for manufacturing the device.

Next, the operation method in the present invention will be described. First, an N-channel memory cell will be described. FIGS. 8A~8C and FIG. 8I are diagrams illustrating the operation of an N-type non-volatile memory. FIGS. 8D~8E are diagrams illustrating the operation of a P-type non-volatile memory. In an operation with normal bias, the voltage which allows the memory cell to have the maximum turn-on current is voltage VD, and voltage VD is, for example, about 2.5V.

The voltage levels described below comply with foregoing parameter.

As shown in FIG. 8A, a voltage V1 is supplied to the gate, wherein voltage V1 is higher than voltage VD and which is, for example, about 3~7V. A voltage V2 is supplied to the N-type drain region, wherein voltage V2 is 1.5~3 times of voltage VD and which is, for example, about 3~7V. The N-type source region and the P-type substrate are grounded. Electrons are injected into the charge storage layer with channel hot electron injection.

As shown in FIG. 8B, a voltage V3 is supplied to the gate, wherein voltage V3 is lower than 0V and which is, for example, about −3~−7V. A voltage V4 is supplied to the N-type drain region, wherein voltage V4 is 1.5~3 times of voltage VD and which is, for example, about 3~7V. The N-type source region is floated, and the P-type substrate is grounded. Holes are injected into the charge storage layer with band-to-band tunneling induced hot hole injection.

As shown in FIG. 8C, a voltage V5 is supplied to the gate, wherein voltage V5 is higher than the threshold voltage Vth of the memory cell and lower than voltage VD and which is, for example, about 1V. A voltage V6 is supplied to the N-type drain region, wherein voltage V6 is 1.5~3 times of voltage VD and which is, for example, about 3~7V. A voltage of 0V is supplied to the N-type source region and the P-type substrate. Holes are injected into the charge storage layer with drain breakdown induced hot hole injection.

Figure 8I:
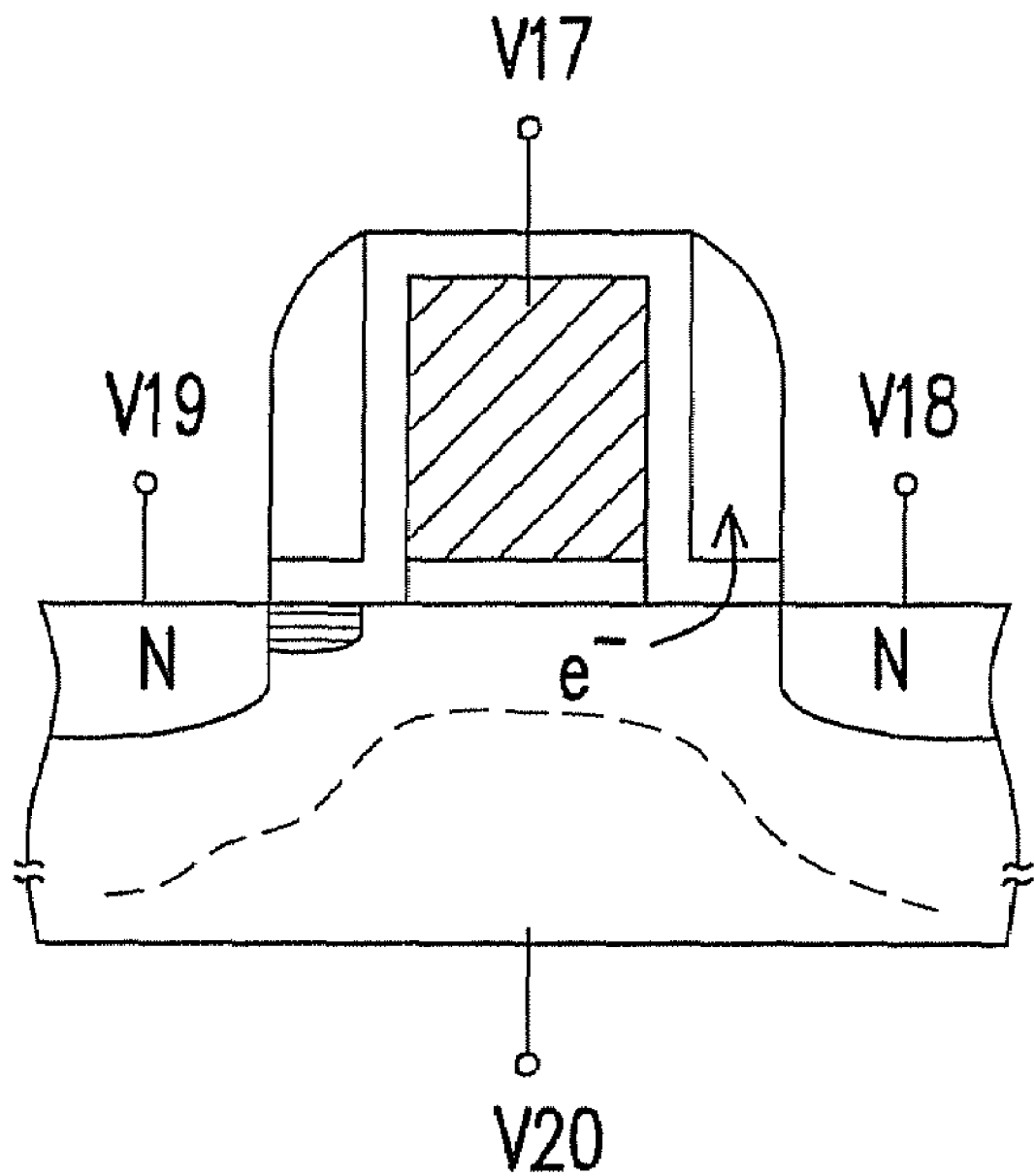

As shown in FIG. 8I, a voltage V17 is supplied to the gate, wherein voltage V17 is higher than voltage VD and which is, for example, about 3~7V. A voltage V18 is supplied to the N-type drain region, wherein voltage V18 is 1.5~3 times of voltage VD and which is, for example, about 3~7V. A voltage V19 is supplied to the N-type source region and which is, for example, about 0~2V. A voltage V20 is supplied to the P-type substrate and which is, for example, about 0~−2V. Electrons are injected into the charge storage layer with channel hot carrier induced secondary carrier injection.

As shown in FIG. 8D, a voltage V7 is supplied to the gate, wherein voltage V7 is lower than the threshold voltage Vth of the memory cell and which is, for example, about −3~−7V. A voltage V8 is supplied to the P-type drain region, wherein voltage V8 is the negative of 1.5~3 times of voltage VD and which is, for example, about −3~−7V. A voltage of 0V is supplied to the P-type source region and the N-type substrate. Electrons are injected into the charge storage layer with channel hot electron injection.

As shown in FIG. 8E, a voltage V9 is supplied to the gate, wherein voltage V9 is higher than 0V and which is, for example, about 3~7V. A voltage V10 is supplied to the P-type drain region, wherein voltage V10 is the negative of 1.5~3 times of voltage VD and which is, for example, about −3~−7V. The P-type source region is floated, and a voltage of 0V is supplied to the N-type substrate. Electrons are injected into the charge storage layer with band-to-band tunneling induced hot hole injection.

Next, the reading method of the present invention will be described. FIGS. 8F and 8G illustrate the reading operation of a non-volatile memory according to an embodiment of the present invention. FIG. 8F is a diagram illustrating a right reading operation performed to a non-volatile memory according to an embodiment of the present invention, and FIG. 8G is a diagram illustrating an inverse reading operation performed to a non-volatile memory according to an embodiment of the present invention.

As shown in FIG. 8F, a voltage Vr1 is supplied to the gate, wherein voltage Vr1 is equal to voltage VD and which is, for example, about 2.5V. A voltage Vr2 is supplied to the second conductive type drain region, and voltage Vr2 is, for example, about 1V. A voltage of 0V is supplied to the second conductive type source region. In the situation described above, the digital data stored in the memory cell can be determined by detecting the channel current in the memory cell.

As shown in FIG. 8G, a voltage Vr3 is supplied to the gate, wherein voltage Vr3 is equal to voltage VD and which is, for example, about 2.5V. A voltage Vr4 is supplied to the second conductive type source region, and the voltage Vr4 is, for example, about 1V or 1.5V. A voltage Vr5 is supplied to the second conductive type drain region, and the voltage Vr5 is, for example, about 0V or 0.5V. In the situation described above, the digital data stored in the memory cell can be determined by detecting the channel current in the memory cell.

According to the operation method of a non-volatile memory in the present invention, charges stored in the memory cell may also be erased by high power radiation (for example, ultraviolet radiation) or by FN tunneling effect.

FIG. 8H is a diagram illustrating an erasing operation performed to a non-volatile memory according to an embodiment of the present invention.

As shown in FIG. 8H, when erasing the memory cell with FN tunneling effect, a voltage Ve1 is supplied to the gate, a voltage Ve2 is supplied to the second conductive type drain region, and the second conductive type source region and the first conductive type substrate is floated. Wherein the voltage difference between voltage Ve1 and voltage Ve2 may induce FN tunneling effect. Voltage Ve1 is about −6~−10V, and voltage Ve2 is about 3~7V. However, voltage Ve1 may also be about 6~10V, and voltage Ve2 may also be about −3~−7V.

According to the operation method of a non-volatile memory in the present invention, electrons or holes are injected into the charge storage layer by one of channel hot electron injection, band-to-band tunneling induced hot hole injection, drain breakdown induced hot hole injection, and channel hot carrier induced secondary carrier injection, so as to program/erase the memory cell. Right reading or inverse reading can be performed to the non-volatile memory in the present invention. Besides, charges stored in the memory cell may also be erased by using high power radiation (for example, ultraviolet radiation) or FN tunneling effect.

Besides, in the memory cell of the present invention, a lightly doped region of the same conductive type as that of the source region at the source, no lightly doped region is formed at the drain or the substrate at the drain is neutralized, or even a lightly doped region of the inverse conductive type of that of the drain region is formed at the drain, so that at reading the memory cell, regardless right reading or inverse reading, the memory cell in the present invention has smaller turn-on current and better device performance compared to conventional memory cell wherein lightly doped regions of the same conductive type as that of the source region are formed at both the source and the drain.

Next, the operations of a non-volatile memory array in the present invention will be described, which includes programming, erasing, and data reading. An exemplary embodiment of the operation method of a non-volatile memory will be described below; however, the operation method is not limited thereto. The memory unit Q13 illustrated in FIGS. 2A and 2B will be described below as an example.

Referring to both FIG. 2A and FIG. 2B, when a programming operation is performed to the selected memory cell Q13, a voltage Vp1, for example, 5V, is supplied to the selected word line WL3. A voltage Vp2, for example, 5V, is supplied to the selected bit line BL1. The selected source line SL2 is grounded. The other non-selected word lines WL1~WL2, WL4~WL6, non-selected bit lines BL2~BL4, and source lines SL1 and SL3~SL4 are grounded. The selected memory cell Q13 is programmed by channel hot electron injection.

Referring to both FIG. 2A and FIG. 2B, when an erasing operation is performed to the selected memory cell Q13, a voltage Ve1, for example, −5V, is supplied to the selected word line WL3. A voltage Ve2, for example, 5V, is supplied to the selected bit line BL1. The selected source line SL2 is floated. The other non-selected world lines WL1~WL2, WL4~WL6, non-selected bit lines BL2~BL4, and source lines SL1, SL3~SL4 are grounded. The selected memory cell Q13 is erased by band-to-band tunneling induced hot hole injection. The voltage Ve1, for example, −5V, is supplied to all the word lines WL1~WL6, the voltage Ve2, for example, 5V, is supplied to all the bit lines BL1~BL4, and all the source lines SL2 are floating, so as to erase all the memory cells in the entire section.

Referring to both FIG. 2A and FIG. 2B, when a reading operation is performed to the selected memory cell Q13, a voltage Vr1, for example, 2.5V, is supplied to the selected word line WL3, a voltage Vr2, for example, 0.5V, is supplied to the selected bit line BL1, a voltage Vr3, for example, 1V, is supplied to the selected source line SL2, and the other non-selected word lines WL1~WL2, WL4~WL6, non-selected bit lines BL2~BL4, and the source lines SL1, and SL3~SL4 are grounded, so as to read the selected memory cell Q13.

In foregoing description, the operations are performed to only one memory cell in the memory cell array, however, the programming, erasing, or reading operation may also be performed to memory cells in unit of bite, section, or block by controlling the word lines, source lines, and bit lines in a non-volatile memory array of the present invention.

The operation patterns of another non-volatile memory array in the present invention will be described next. The operations include programming, erasing, and data reading. The memory cell Q13 illustrated in FIG. 3A and FIG. 3B will be described below as an example.

Referring to both FIG. 3A and FIG. 3B, when a programming operation is performed to the selected memory cell Q13, a voltage Vp1, for example, 5V, is supplied to the selected word line WL3. A voltage Vp2, for example, 5V, is supplied to the selected bit line BL4 connected to the drain of the selected memory cell Q13. The selected bit line BL3 connected to the source of the selected memory cell Q13 is grounded. A voltage Vp3, for example, 3V, is supplied to the non-selected bit lines BL5~BL7 formed at the drain of the selected memory cell Q13 to prevent the memory cells connected to the non-selected bit lines BL5~BL7 from being programmed. The other non-selected word lines WL1~WL2, WL4~WL6 and the non-selected bit lines BL1~BL2 formed at the source of the selected memory cell Q13 are grounded. The selected memory cell Q13 is programmed by channel hot electron injection.

Referring to both FIG. 3A and FIG. 3B, when an erasing operation is performed to the selected memory cell Q13, a voltage Ve1, for example, −5V, is supplied to the selected word line WL3. A voltage Ve2, for example, 5V, is supplied to the selected bit line BL4 connected to the drain of the selected memory cell Q13. The selected bit line BL3 connected to the source of the selected memory cell Q13 is floated. A voltage Vp3, for example, 3V, is supplied to the non-selected bit lines BL5~BL7 formed at the drain of the selected memory cell Q13 to prevent the memory cells connected to the non-selected bit lines BL5~BL7 from being erased. The other non-selected word lines WL1~WL2, WL4~WL6 and the non-selected bit lines BL1~BL2 formed at the source of the selected memory cell Q13. The selected memory cell Q13 is erased by band-to-band tunneling induced hot hole injection.

Referring to both FIG. 3A and FIG. 3B, when a reading operation is performed to the selected memory cell Q13, a voltage Vr1, for example, 2.5V, is supplied to the selected word line WL3. A voltage Vr2, for example, 0.5V, is supplied to the selected bit line BL3. A voltage Vr3, for example, 1V, is supplied to the selected bit line BL4. The voltage Vr2, for example, 0.5V, is supplied to the non-selected bit lines BL5~BL7 formed at the drain of the selected memory cell Q13. The voltage Vr3, for example, 1V, is supplied to the non-selected bit lines BL1~BL2 formed at the source of the selected memory cell Q13. The other non-selected word lines WL1~WL2 and WL4~WL6 are grounded.

In foregoing description, the operations are performed to only one memory cell in the memory cell array, however, the programming, erasing, or reading operation may also be performed to memory cells in unit of bite, section, or block by controlling the word lines, source lines, and bit lines in a non-volatile memory array of the present invention.

In overview, in a non-volatile memory of the present invention, the charge storage layer of a memory cell is formed on the sidewall of the gate structure, and which is different from that in a conventional SONOS, the ONO layer is formed below the gate. The structure in the present invention can greatly reduce the size of the device.

Moreover, the manufacturing method of a non-volatile memory in the present invention can be integrated with a typical CMOS process and no photolithography etching process with multiple masks is required, thus, the manufacturing time of the device can be shortened.

Furthermore, according to a memory cell in the present invention, a lightly doped region of the same conductive type as that of the source region is formed at the source and no lightly doped region is formed at the drain or the substrate at the drain is neutralized, or even a lightly doped region of the inverse conductive type as that of the drain region is formed at the drain, thus, regardless right reading or inverse reading, the turn-on current at reading the memory cell is smaller, so that better device performance can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operation method of a non-volatile memory, suitable for a memory cell formed in a first conductive type substrate, the memory cell comprising a gate formed on the first conductive type substrate, a second conductive type drain region and a second conductive type source region formed in the first conductive type substrate at two sides of the gate, a charge storage layer formed on the first conductive type substrate between the gate and the second conductive type drain region, and a second conductive type first lightly doped region formed in the first conductive type substrate between the gate and the second conductive type source region, in an operation with normal bias, the voltage that allowing the memory cell to have the maximum turn-on current being a $1^{st}$ voltage, the operation method comprising:
   injecting electrons or holes into the charge storage layer by using one of channel hot electron (hole) injection, band-to-band tunneling induced hot hole (electron) injection, drain avalanche breakdown induced hot hole injection, and channel hot carrier induced secondary carrier injection.

2. The operation method as claimed in claim 1, wherein the first conductive type is P-type and the second conductive type is N-type.

3. The operation method as claimed in claim 2, wherein when electrons are injected into the charge storage layer by channel hot electron injection, a $2^{nd}$ voltage is supplied to the gate, and a $3^{rd}$ voltage is supplied to the second conductive type drain region.

4. The operation method as claimed in claim 3, wherein the second conductive type source region and the first conductive type substrate are grounded, the $2^{nd}$ voltage is higher than the $1^{st}$ voltage, and the $3^{rd}$ voltage is 1.5~3 times of the $1^{st}$ voltage.

5. The operation method as claimed in claim 4, wherein the $2^{nd}$ voltage is about 3~7V, and the $3^{rd}$ voltage is about 3~7V.

6. The operation method as claimed in claim 2, wherein when holes are injected into the charge storage layer by band-to-band tunneling induced hot hole injection, a $4^{th}$ voltage is supplied to the gate, and a $5^{th}$ voltage is supplied to the second conductive type drain region.

7. The operation method as claimed in claim 6, wherein the second conductive type source region is floated, the first conductive type substrate is grounded, the $4^{th}$ voltage is lower than 0V, the second conductive type source region is floated, the first conductive type substrate is grounded, the $4^{th}$ voltage is lower than 0V, and the $5^{th}$ voltage is 1.5~3 times of the $5^{th}$ voltage.

8. The operation method as claimed in claim 7, wherein the $4^{th}$ voltage is about −3~−7V, and the $5^{th}$ voltage is about 3~7V.

9. The operation method as claimed in claim 2, wherein when holes are injected into the charge storage layer by drain breakdown induced hot hole injection, a $6^{th}$ voltage is supplied to the gate, and a $7^{th}$ voltage is supplied to the second conductive type drain region.

10. The operation method as claimed in claim 9, wherein a voltage of 0V is supplied to the second conductive type source region and the first conductive type substrate, the $6^{th}$ voltage is higher than the threshold voltage of the memory cell and lower than the $1^{st}$ voltage, and the $7^{th}$ voltage is 1.5~3 times of the $1^{st}$ voltage.

11. The operation method as claimed in claim 10, wherein the $6^{th}$ voltage is about 0.4~2V, and the $7^{th}$ voltage is about 3~7V.

12. The operation method as claimed in claim 1, wherein the first conductive type is N-type, and the second conductive type is P-type.

13. The operation method as claimed in claim 12, wherein when electrons are injected into the charge storage layer by channel hot electron injection, an $8^{th}$ voltage is supplied to the gate, and a $9^{th}$ voltage is supplied to the second conductive type drain region.

14. The operation method as claimed in claim 13, wherein a voltage of 0V is supplied to the second conductive type source region and the first conductive type substrate, the $8^{th}$ voltage is lower than or equal to the threshold voltage of the memory cell, and the $9^{th}$ voltage is the negative of 1.5~3 times of the $1^{st}$ voltage.

15. The operation method as claimed in claim 14, wherein the $8^{th}$ voltage is about $-3\sim-7V$, and the $9^{th}$ voltage is about $-3\sim-7V$.

16. The operation method as claimed in claim 12, wherein when electrons are injected into the charge storage layer by band-to-band tunneling induced hot hole injection, a $10^{th}$ voltage is supplied to the gate, and a $11^{th}$ voltage is supplied to the second conductive type drain region.

17. The operation method as claimed in claim 16, wherein the second conductive type source region is floated, a voltage of 0V is supplied to the first conductive type substrate, the $10^{th}$ voltage is higher than 0V, and the $11^{th}$ voltage is the negative of 1.5~3 times of the $1^{st}$ voltage.

18. The operation method as claimed in claim 17, wherein the $10^{th}$ voltage is about 3~7V, and the $11^{th}$ voltage is about $-3\sim-7V$.

19. The operation method as claimed in claim 1, further comprising supplying a $12^{th}$ voltage to the gate, a $13^{th}$ voltage to the second conductive type drain region, and a $14^{th}$ voltage to the second conductive type source region at reading the memory cell, the $12^{th}$ voltage being equal to the $1^{st}$ voltage.

20. The operation method as claimed in claim 19, wherein the $12^{th}$ voltage turns on the channel below the gate, and the $13^{th}$ voltage is higher than the $14^{th}$ voltage.

21. The operation method as claimed in claim 20, wherein the $12^{th}$ voltage is about 2.5V, the $13^{th}$ voltage is about 1V, and the $14^{th}$ voltage is about 0V.

22. The operation method as claimed in claim 19, wherein the $12^{th}$ voltage turns on the channel below the gate, and the $14^{th}$ voltage is higher than the $13^{th}$ voltage.

23. The operation method as claimed in claim 22, wherein the $12^{th}$ voltage is about 2.5V, the $13^{th}$ voltage is about 0V or 0.5V, and the $14^{th}$ voltage is about 1V or 1.5V.

24. The operation method as claimed in claim 1, further comprising erasing the charges stored in the memory cell with a high power radiation.

25. The operation method as claimed in claim 24, wherein the high power radiation comprises ultraviolet radiation.

26. The operation method as claimed in claim 1, further comprising erasing the charges stored in the memory cell by FN tunneling effect.

27. The operation method as claimed in claim 26, wherein when erasing the memory cell by FN tunneling effect, a $15^{th}$ voltage is supplied to the gate, a $16^{th}$ voltage is supplied to the second conductive type drain region, the second conductive type source region and the first conductive type substrate are floated, and the voltage difference between the $15^{th}$ voltage and the $16^{th}$ voltage may induce FN tunneling effect.

28. The operation method as claimed in claim 27, wherein the $15^{th}$ voltage is about $-6\sim-10V$, and the $16^{th}$ voltage is about 3~7V.

29. The operation method as claimed in claim 27, wherein the $15^{th}$ voltage is about 6~10V, and the $16^{th}$ voltage is about $-3\sim-7V$.

30. The operation method as claimed in claim 1, further comprising injecting charges into the charge storage layer by channel hot carrier induced secondary carrier injection.

31. The operation method as claimed in claim 12, wherein when electrons are injected into the charge storage layer by channel hot carrier induced secondary carrier injection, a $17^{th}$ voltage is supplied to the gate, a $18^{th}$ voltage is supplied to the second conductive type drain region, a $19^{th}$ voltage is supplied to the second conductive type source region, and a $12^{th}$ voltage is supplied to the first conductive type substrate.

32. The operation method as claimed in claim 31, wherein the $17^{th}$ voltage is higher than the $1^{st}$ voltage, the $18^{th}$ voltage is the negative of 1.5~3 times of the $1^{st}$ voltage, and $19^{th}$ voltage is between the $1^{st}$ voltage and 0V, and the $20^{th}$ voltage is lower than or equal to 0V.

33. The operation method as claimed in claim 32, wherein the $17^{th}$ voltage is 3~7V, the $18^{th}$ voltage is about $-3\sim-7V$, the $19^{th}$ voltage is about 0~2V, and the $20^{th}$ voltage is about 0~2V.

* * * * *